(12) United States Patent
Amaratunga et al.

(10) Patent No.: US 6,259,134 B1
(45) Date of Patent: *Jul. 10, 2001

(54) TRENCH THYRISTOR WITH IMPROVED BREAKDOWN VOLTAGE CHARACTERISTICS

(75) Inventors: Gehan A. J Amaratunga; Florin Udrea, both of Cambridge (GB)

(73) Assignee: Mitel Semiconductor Limited (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/112,978

(22) Filed: Jul. 9, 1998

(30) Foreign Application Priority Data

Jul. 11, 1997 (GB) .................................. 9714597

(51) Int. Cl.[7] .................................................. H01L 29/76
(52) U.S. Cl. ........................... 257/330; 257/135; 257/136
(58) Field of Search ............................. 257/330, 136, 257/135, 139, 168, 175, 260, 262, 161

(56) References Cited

U.S. PATENT DOCUMENTS

| | | | |
|---|---|---|---|
| 4,395,723 | * | 7/1983 | Harari ........................... 257/260 |
| 4,618,781 | * | 10/1986 | Silber et al. ..................... 257/165 |
| 5,086,330 | * | 2/1992 | Minato .......................... 257/136 |
| 5,202,750 | * | 4/1993 | Gough .......................... 257/133 |
| 5,324,966 | * | 6/1994 | Muraoka et al. ................. 257/136 |
| 5,381,026 | | 1/1995 | Shinohe et al. . |
| 5,569,941 | * | 10/1996 | Takahashi ...................... 257/133 |
| 5,637,888 | * | 6/1997 | Iwamuro ........................ 257/139 |
| 5,751,024 | * | 5/1998 | Takahashi ...................... 257/139 |
| 5,895,939 | * | 4/1999 | Ueno ............................ 257/279 |

FOREIGN PATENT DOCUMENTS 0 480 356 A2    4/1992 (EP) .

* cited by examiner

Primary Examiner—Olik Chaudhuri
Assistant Examiner—Nathan W. Ha
(74) Attorney, Agent, or Firm—Kirschstein, et al

(57) ABSTRACT

A MOS-controllable power semiconductor trench device has a gate in the form of a trench which extends through a region of p type silicon into an n type region of low conductivity. A discontinous buried p layer below the bottom of the trench forms part of a thyristor which in operation is triggered into conduction by conduction of a PIN diode which is produced when an accumulation layer is formed in the n type region adjacent to the trench under the action of an on-state gate signal. The device has a high on-state conductivity and is protected against high voltage breakdown in its off-state by the presence of the buried layer. An off-state gate signal causes removal of the accumulation layer and conduction of the PIN diode and the thyristor ceases in safe, reliable and rapid manner.

19 Claims, 6 Drawing Sheets

TRENCH THYRISTOR WITH IMPROVED BREAKDOWN VOLTAGE CHARACTERISTICS

BACKGROUND OF THE INVENTION

This invention relates to semiconductor devices, and is particularly concerned with trench devices, i.e., devices in which at least one electrode is set into the wall or bottom or forms part of a trench or recess below a major, usually planar, surface of a semiconductor device. The use of trenches is particularly advantageous for devices such as IGBT's (insulated gate bipolar transistors) which are capable of operating at high power and voltage levels. The limit on the upper value of voltage at which such devices can be used is determined by the breakdown voltage of a device. For a device which is capable of operating at high power and at high voltage levels, it is important that the device has a low on-state resistance and turns-off (i.e., current flow through the device ceases) promptly and reliably in response to a turn-off signal. It has proved difficult to produce such a device which reliably meets the conflicting requirements of high current, high voltage operation and a safe, reliable current control characteristic.

SUMMARY OF THE INVENTION

According to a first aspect of this invention, a MOS-controllable power semiconductor trench device having a trench gate extending into a first surface of a semiconductor body includes a thyristor structure located between said first surface and a second surface of the body; in which a gate signal is arranged to form an accumulation layer at a wall of the trench, said layer being part of a PIN diode created thereby, and the PIN diode being electrically in parallel with said thyristor, a base portion of which serves to protect the trench against high electric field breakdown when the device is in a non-conductive state; and wherein conduction of the PIN diode is arranged to trigger said thyristor into a conductive state which state persists while, and only while, said accumulation layer is present.

According to a second aspect of this invention, a MOS controllable power semiconductor trench device includes an active region having one or more trenches extending from a first surface of the device, with the trench penetrating first and second semiconductor regions of differing first and second conductivities so that current across the junction between said first and second regions is controllable by a field effect gate electrode at a wall region of the trench, and which electrode is operative to form a charge accumulation layer in said second region; localized regions of said first conductivity type being located within said second region and between said first region and a second surface of the device, said localized regions forming part of a thyristor structure, and the portion of said second region which is between adjacent said localized regions forming, in conjunction with said accumulation layer, part of a PIN diode, such that in operation forward conduction of said PIN diode initiates thyristor conduction in said localized regions for which said accumulation layer acts as the emitter thereof, said localized regions serving to protect said trench against high electric field breakdown while said device is in a non-conductive state.

According to a third aspect of this invention, a MOS-controllable power semiconductor trench device includes an active region having one or more trenches extending from a first surface of the device, with the trench penetrating an n+cathode region, a p region and an n base region so that a current between the n+cathode region and the n base region is controllable by a field effect gate electrode at a wall region of the trench formed in the p region and the n base region, and which electrode is operative to form an electron inversion layer in the p region and an electron accumulation layer in the n base region; the base region extending towards a p+ anode region; localized regions of p conductivity type being located within said n base region between the electron accumulation layer and the p+ anode region, said localized regions forming part of a thyristor structure with the electron accumulation layer as the electron emitter and the p+ anode region as the hole emitter thereof; the portion of the n base region which is between adjacent localized p regions being part of a PIN diode formed in conjunction with the electron accumulation layer and the p+ anode region such that in the on-state the PIN diode is in forward conduction and in parallel with the thyristor, and the PIN diode initiates thyristor conduction in said localized regions which serve to protect the said trench against high electric fields while said device is in its off-state.

Preferably, the n cathode region is shorted by a cathode electrode to the p region, and wherein a portion of the p region adjacent to the cathode electrode is p+ so as to ensure a good ohmic contact and reduced latch up.

An optional n+ layer is desirably present between the p+ anode region and the n base region. This reduces hole injection from the p+ region to speed up turn-off of the device. It also prevents depletion layer punch through to the p+ anode region.

Such a device can be turned-on rapidly, and is able to withstand high off-state potentials. With trench devices, the bottom of the trench and especially corners thereof are prone to voltage breakdown which limits the safe operating range of such devices. The localized regions act as a barrier to the high potential field and thus protect the trench.

BRIEF DESCRIPTION OF THE DRAWINGS

The invention is further described by way of example with reference to the accompanying drawings, in which.

DETAILED DESCRIPTION OF THE PREFERRED EMBODIMENTS

Figure 1:
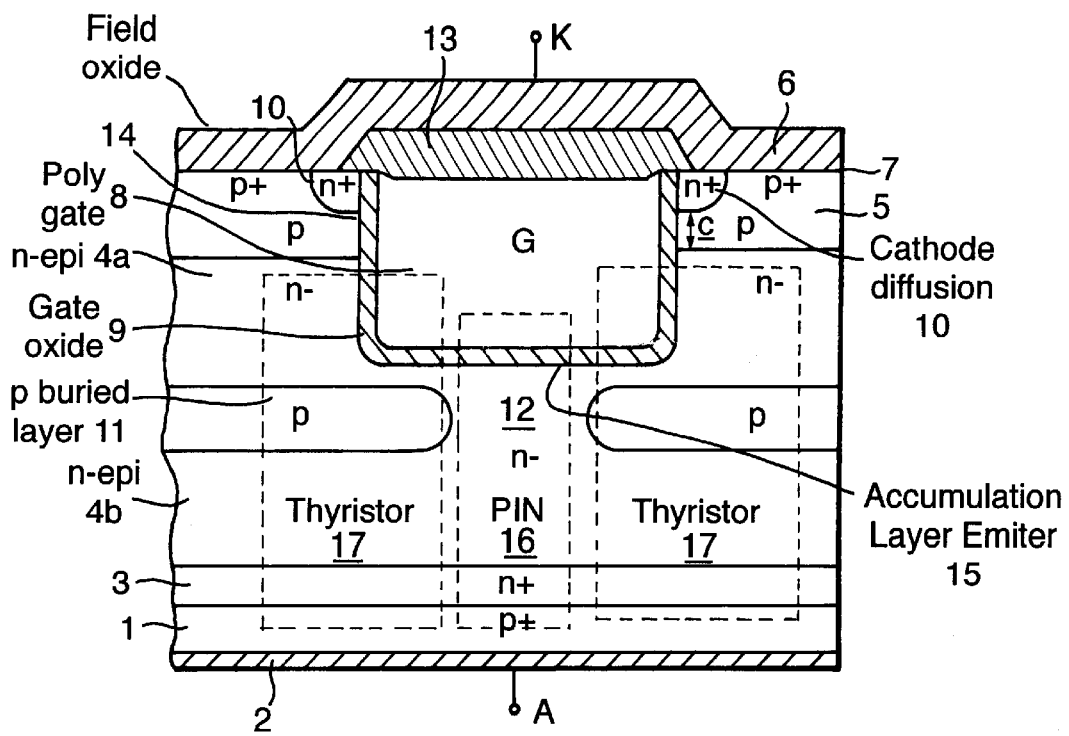
FIG. 1 is a sectional view of a power semiconductor trench device in accordance with the invention.

Referring to FIG. 1, a MOS-controllable power semiconductor trench device consists of a p+ silicon substrate 1 having an anode electrode 2 at its lower surface, and having an n+ epitaxial layer 3 and a thicker n–epitaxial layer 4 above it. A p layer 5 is formed above the layer 4, and the upper boundary of the layer 5, to which a cathode electrode 6 is attached, constitutes the upper surface 7 the device. As the layer 5 is formed by diffusion into the n–layer 4, the region of layer 5 has a higher concentration at the surface 7, and so is designated p+. Alternatively, a p+ layer can be formed at the surface 7 by implant/diffusion to ensure a good ohmic contact.

A trench electrode 8 extends from the upper surface 7 into the body of the device. The electrode 8 is of conductive polysil icon, and is provided with a thin insulating oxide layer 9 at its outer surface. Cathode diffusion regions 10 of n+ silicon are formed at the surface 7 where it abuts the oxide layer 9, and the pn junction between regions 5 and 10 is electrically shorted at the surface 7 by the cathode electrode 6.

Buried regions 11 of p type silicon are formed in the n–layer 4, so as to be relatively close to the bottom of the trench electrode 8, but spaced apart from it by an intervening region of n–material. The regions 11 may conveniently be formed by diffusion into the epitaxial layer 4 during a pause in the epitaxial growth. The regions 11 may be separate discrete islands spaced apart by intervening regions 12 of the layer 4, or the regions 11 may take the form of a continuous layer in which regions 12 are apertures therein, but in such a case the continuous layer stops short of the edges of the device. Alternatively, the regions 11 and 12 could take the form of elongate stripe-like layers or the like extending across the device. The effect of the regions 11 is to functionally divide the region 4 into upper section 4a and lower section 4b.

The gate electrode 8 is electrically insulated from the cathode 6 by an intervening oxide 13, and external electrical contact is made to it by conventional means, not shown.

The dimensions and concentrations of the conductivity modifiers in the silicon depend on the maximum voltage at which the device is to be operated, but typical, approximate, figures for a 600 volt device are as follows, starting with the region adjacent to upper surface 7.

| Region | Thickness | Concentration |
| --- | --- | --- |
| n + region 10 | 1 μm | $5 \times 10^{19}$ to $10^{21}$ cm$^{-3}$ |
| p region 5 | 2 μm | $2 \times 10^{17}$ cm$^{-3}$ |
| n – region 4a | 3 to 8 μm | $10^{14}$ cm$^{-3}$ |
| p layer 11 | 1.5 to 2 μm | $10^{16}$ to $5 \times 10^{16}$ cm$^{-3}$ |
| n – region 4b | 50 μm | $10^{14}$ cm$^{-3}$ |
| n + layer 3 | 6 μm | $10^{16}$ cm$^{-3}$ |
| p + substrate 1 | relatively thick | $10^{19}$ cm$^{-3}$ |

As typically, the substrate 1 is the thickest layer, it will be apparent that FIG. 1 is not to scale, but has been drawn to emphasize the more important aspects of the invention.

The vertical spacing between the bottom of the oxide 9 and the top of the p region 11 is about 1 μm, and the length of the channel, (shown as distance c) is less than 1μ.

Instead of using the p+ anode region as a substrate, the n type base region may be the substrate into which various conductivity modifying materials are introduced to form the succession of electrically different regions.

For a device intended to operate at a higher voltage, e.g., 4.5 kV, the thickness of the n–region 4b could be 500 μm, and the concentration of the region 4 as a whole could be $10^{13}$cm$^{-3}$, other figures remaining the same, but it is to be understood that all figures are given by way of example and explanation only, and that in practice they will depend on the materials and processes actually used to manufacture the device.

The device operates as follows. Initially it is assumed that a high potential exists between anode and cathode, and that the device is in its non-conductive state.

When a positive potential is applied to the gate 8 a short electron inversion channel 14 of length c is formed in the p region 5 adjacent to the gate oxide 9 and an n+accumulation layer 15 is formed in the n– base 4 adjacent to the side walls and bottom walls of the trench electrode. This allows electrons to be injected into the n– base 4 followed by hole injection from the anode 2 into the n– base 4. Part of the hole current will travel through the p+ buried regions 11 to the cathode contact 6 and some of the holes will recombine with electrons injected from the accumulation layer 15 between the two regions of p layer 5. Thus, PIN diode 16 formed between the n+ accumulation layer 15/n– base 4/n+ layer 3/p+ anode 1 is active. This diode is located at 12 between the p+buried regions 11 in FIG. 1.

At first, the conductivity modulation at the upper part of the device occurs only in the PIN area, but as the current increases, enhanced carrier injection from the vertical part of the accumulation layer takes place (i.e.,the lower part of the side walls of the trench gate) and an accumulation layer thyristor 17 is formed by the regions: n+ accumulation layer 15/n– base 4 buried layers 11/n– base 4b/p+ anode 1, becomes active. Therefore, the conductivity modulation area extends over the p+ buried regions 11 and at the n– base region 4a situated between the p regions 5 and p+ buried regions 11. The on-state voltage drop decreases abruptly and the device exhibits an on-state resistance close to that of a thyristor or a PIN diode. In view of the action of the accumulation layer, the device is termed an "Accumulation Layer Emitter Thyristor (ALET)". Thus, the PIN diode and the thyristor operate in parallel.

It will be observed that, as is common the term PIN diode is used to describe a diode in which the middle region is not truly intrinsic. In this device the so-called intrinsic region 4, has a very low conductivity, i.e.,lightly doped, and is opposite in type to that of the regions 1 and 5. The "PIN" diode and the thyristor exist only for so long as the accumulation layer 15 is present under the action of the potential on the gate electrode 8.

As explained above, the current path from the cathode 6 is initially through the gate channel (inversion) layer 14 to the accumulation layer 15, and as this current is established, the accumulation layer acts as the emitter of the thyristor 17 which is therefore electrically in parallel with the PIN diode 16. The thyristor may be regarded as having a virtual emitter—it exists only while the accumulation layer is present. Removal of the positive gate signal causes removal of the inversion layer 14, and hence removal of the accumulation layer 15, and thus the thyristor action collapses and the PIN diode ceases to conduct. Thus, application of an off-state signal (i.e., removal of the positive gate signal, which is the same thing) causes the device to turn off in a safe, reliable and rapid manner.

Figure 2:
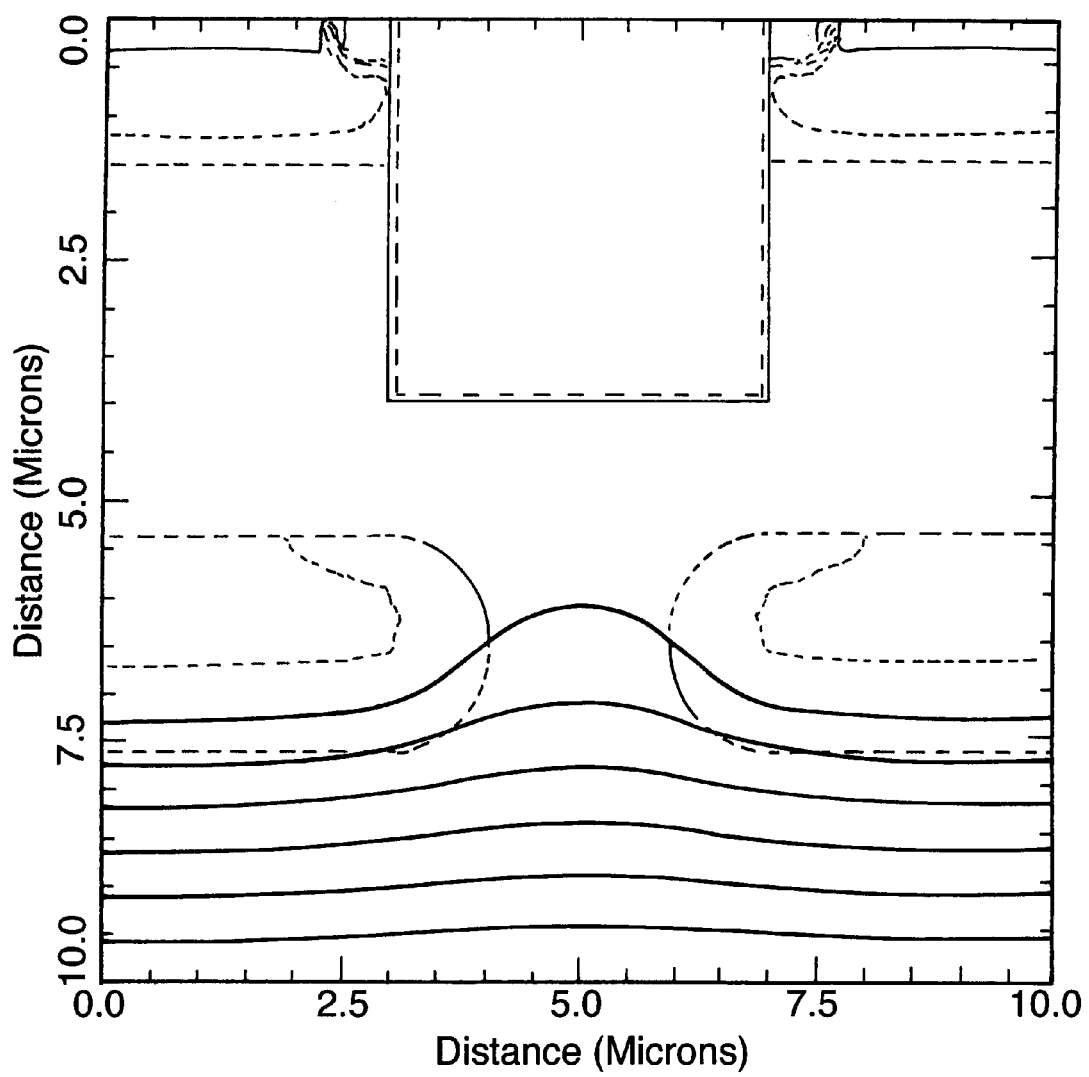
FIG. 2 is an explanatory diagram relating thereto.

The structure of the device enables it to withstand a high off-state voltage. The junction which supports the off-state voltage is the p+ buried region 11/n– base 4b junction. This junction is below the bottom of the trench, and therefore protects very efficiently the trench corners against high electric fields, as is shown in FIG. 2, which illustrates diagrammatically just the upper portion of the device. This is due to the presence of the p+ buried layers which hold the off-state potential lines in the bulk and do not allow potential lines to penetrate into the trench area. Thus, the breakdown voltage is given by the p+ buried layer/n– base junction and is not affected by the presence of the trench body.

Since the off-state voltage at the p well/n– base junction in the ALET is very small, the punch-through of the Trench MOSFET (this is related to the advance of the depletion region in the p regions 5 to the n+ cathode) is prevented. In other words, one can design a short-channel ALET without being constricted by the punch-through condition, as typically is the case of conventional vertical power devices.

Since the off-state voltage across the trench area is very small, thinner oxide layers 9 can be grown onto the trench surface, which results in lower on-state channel voltage drop and more effective accumulation layer injection.

Figure 3:
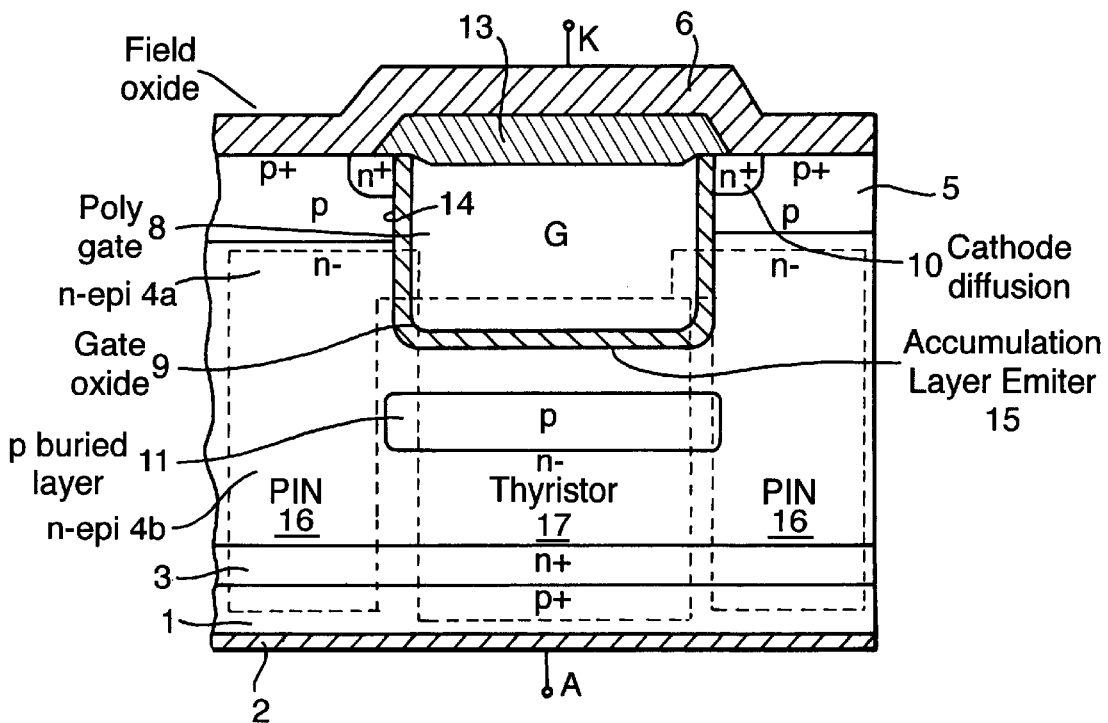
FIG. 3 is a sectional view of an alternative embodiment of the invention.
Figure 4:
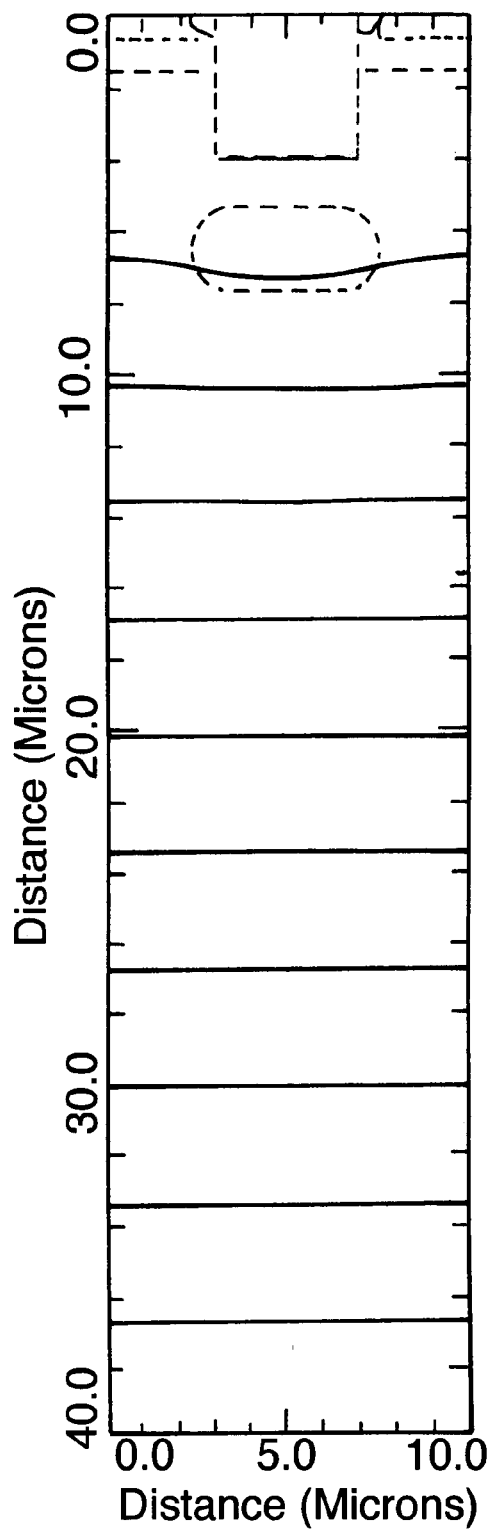
FIGS. 4 and 5 are explanatory diagrams relating thereto.

Another variant of the ALET is shown in FIG. 3 in which like references are used for like parts as in FIG. 1. The p+ buried region 11 is now placed under the trench body and the thyristor 17 is formed in the middle between the n+ accumulation layer 15/p+ buried region 11/n– base 4b and p+ anode 1. The PIN diode structures 16 are now placed on both sides of the thyristor 17. The operation is basically the same. FIG. 4 shows the distribution of the potential lines in relation to the buried region 11 and the trench gate 8, and it will be seen that, as in FIG. 2, the effect of region 11 is to protect the gate 8.

It will be apparent from FIGS. 1 and 3 considered together, that the actual transverse positioning of the buried p regions 11 in relation to the trench gate 8 is not critical, and it is therefore not necessary to align the trench with the buried p regions. In practice, a device carries a large current in its on-state, and a large number of trench regions, and correspondingly large number of buried p regions 11 (or apertures 12 as the case may be) will be provided.

Figure 5:
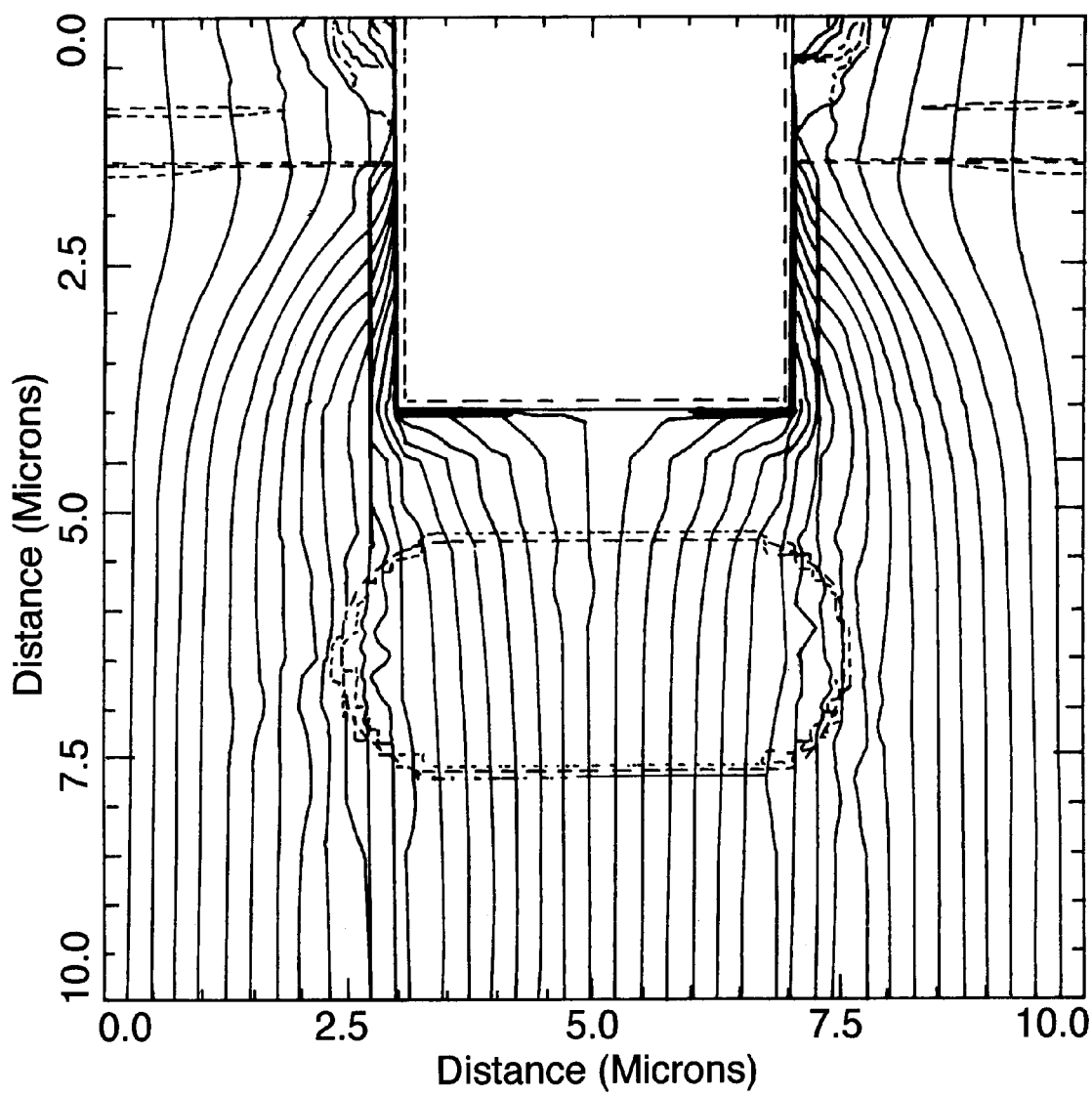

The effective area of the regions 12 compared to that of the p buried regions 11 is not critical, but the regions 11 should not be too far apart, since they act to protect the bottom of the trench from the high field potential. If they are far apart, the potential lines can touch the bottom of the trench during the off-state and thereby reduce the reverse bias voltage breakdown figure of the device. The effect of the correct spacing is shown in FIGS. 2 and 4. On the other hand, if the regions 11 are too close, so that the area of the regions 12 is too small, the initial current conducted by the PIN diode 16 will be small, and the thyristor will be triggered at a higher anode voltage. The vertical position of the regions 11 and 12, typically about 1 $\mu$m, below the bottom of the trench should ideally also be sufficiently large as to prevent the potential lines from touching the bottom of the trench without having to space the buried regions 11 too closely together. FIG. 5 shows the current flow lines of the device of FIG. 3 during its on-state, at high current density when both the PIN diode and the accumulation diode thyristor are fully active.

Figure 6:
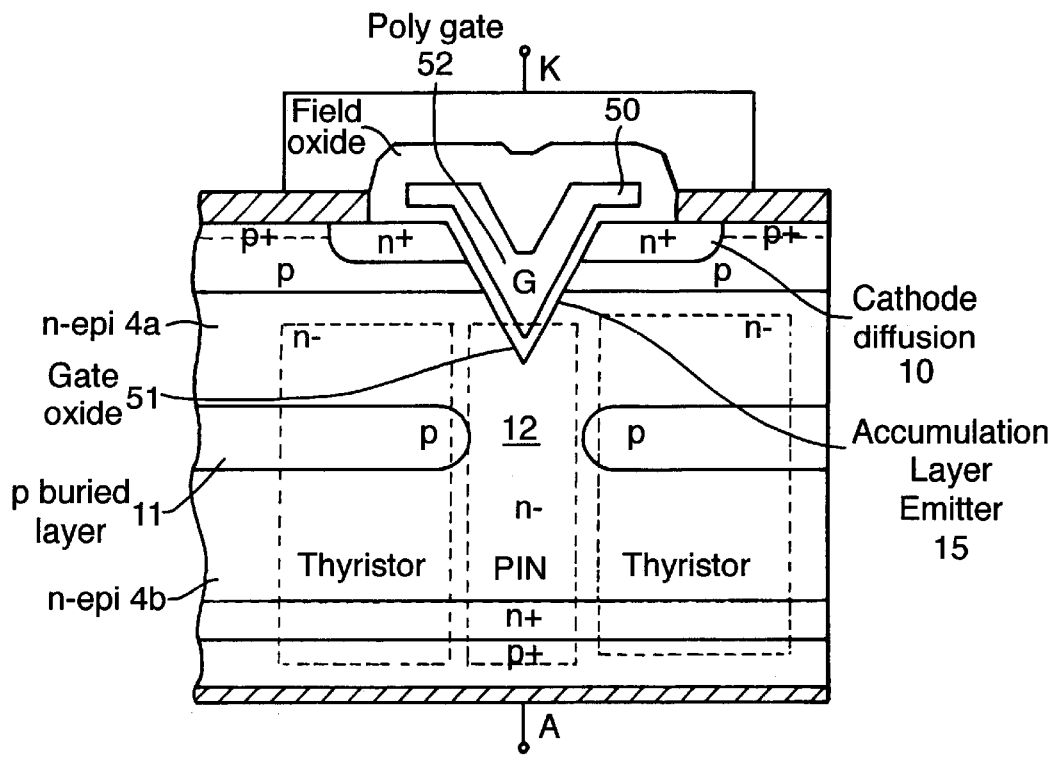
FIG. 6 is a sectional view of a further embodiment of the invention.

A further embodiment of the invention is shown in FIG. 6, in which the gate electrode trench 50 takes the form of a V-groove, although a U shaped groove could be used. In this case, the V-groove can be produced by a simple wet etch process, (as compared with the vertical side wall trenches of FIGS. 1 and 3 which typically would be produced by an an isotropic plasma etch process) before the gate oxide 51 and gate electrode 52 are formed. Conventionally, a V-groove previously would not have been used in a high voltage power semiconductor device, as the bottom, sharp, corner of the groove would be very prone to voltage breakdown. Even for a V-groove low voltage MOSFET (e.g.,up to 100V) the crowding of potential lines around the V corner could lead to premature breakdown in prior art devices. However, in the present embodiment of the invention, the p buried regions 11 hold the potential lines away from the V corner, and so this difficulty is avoided, making the use of the V-groove a practical proposition.

Figure 7:
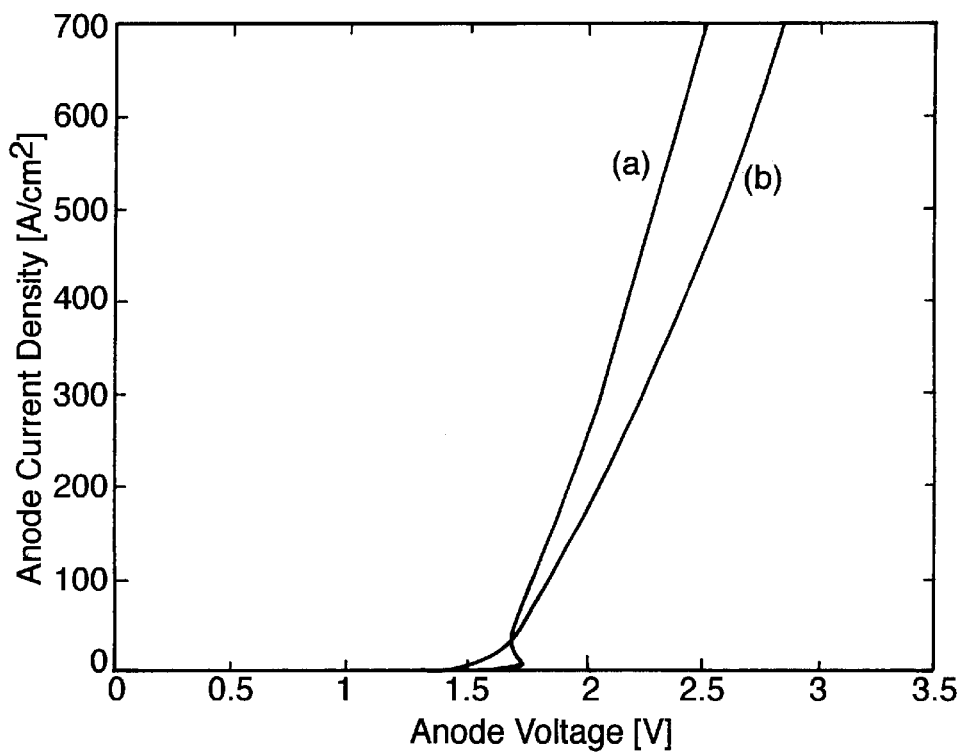
FIG. 7 shows a typical transfer characteristic of devices in accordance with the invention.

FIG. 7 shows a transfer characteristic applicable to the devices shown in FIGS. 1, 3 and 6, in which such a device is represented by curve a, and is compared at line b with a theoretical characteristic obtainable by a previously known trench IGBT. However, in this device the off-state potential is 4.5 kV, a figure difficult to achieve with previously known devices.

Figure 8:
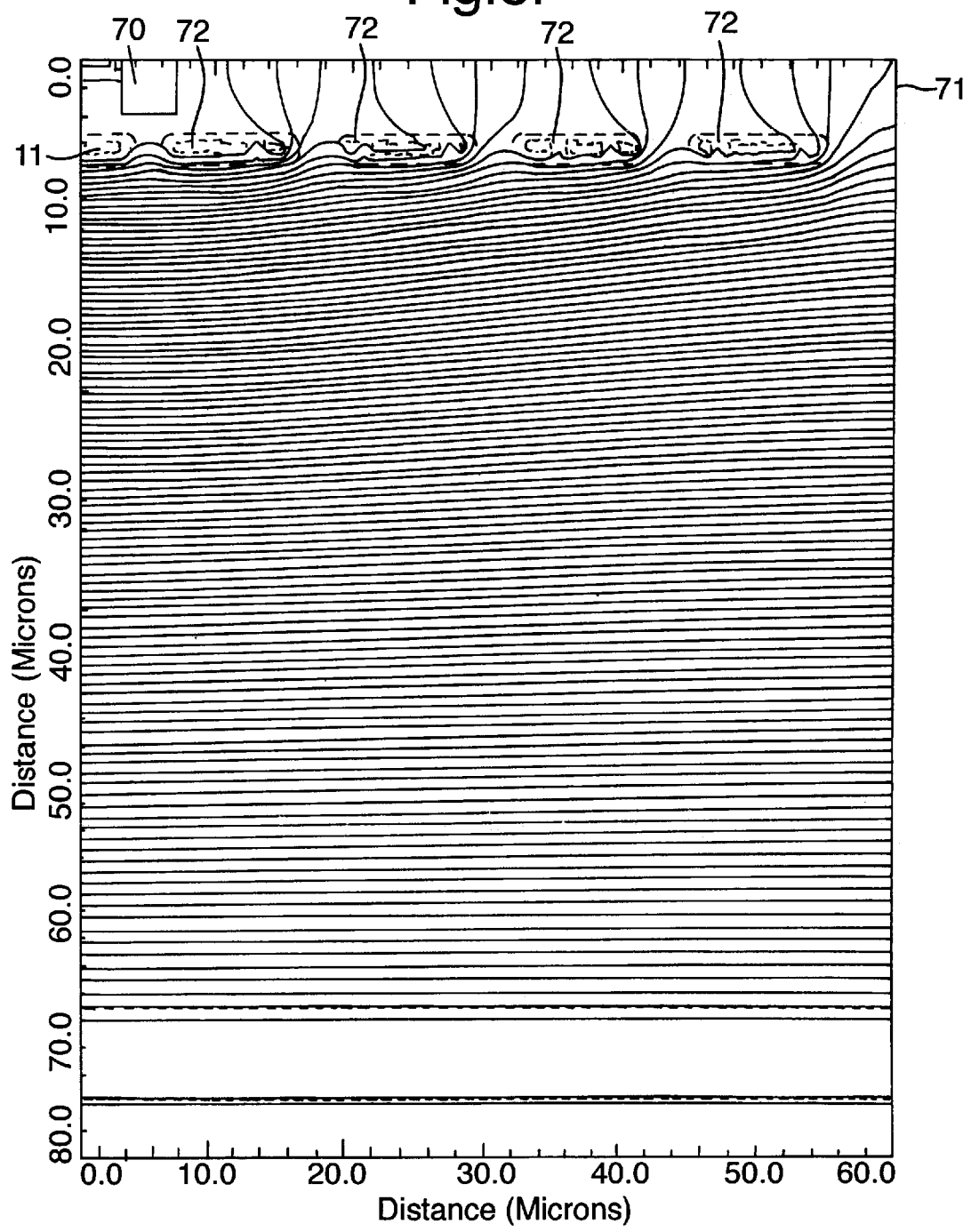
FIG. 8 shows an edge termination arrangement.

In order to prevent voltage breakdown at the edges of the device, which is typically a relatively large silicon wafer, a termination structure is provided. The buried p regions can very conveniently be utilized for this purposes, as is shown diagrammatically in FIG. 8 which represents part of the wafer. In this figure, only a single trench 70 is illustrated, but in practice a large number of similar trenches would be placed to the left of the trench 70 to constitute the active region of the device. The line 71 represents the edge of the wafer, and thus around the active area, a number of further buried p regions 72 are provided in addition to p regions 11. Potential lines are shown, and it will be seen that the potential difference is partially shed by successive regions 72 at the surface of the device. By placing p regions 72 below the surface in the bulk of the device, breakdown occurs in the bulk, and this aspect can represent a significant improvement over previously known termination techniques when the breakdown occurs typically at the surface where the critical electric field is lower than in the bulk and contributes to the ability of the device to withstand very high off-state potentials. These p regions 72 can be formed using the same mask as, and at the same time as, regions 11 and this represents a significant manufacturing advantage.

What is claimed is:

1. A MOS-controllable power semiconductor trench device, comprising: a semiconductor body having a first surface and a second surface; a trench having a gate extending into said first surface of the body, the gate being at a predetermined electrical potential; a thyristor structure located between said first surface and said second surface of the body; an accumulation layer formed at a wall of the trench by the predetermined potential on the gate; a PIN diode electrically in parallel with said thyristor, said accumulation layer forming part of said PIN diode, the trench always terminating short of a base portion of said thyristor to protect the trench against high electric field breakdown when the device is in a non-conductive state; and wherein conduction of said PIN diode is arranged to trigger said thyristor into a conductive state.

2. A MOS-controllable power semiconductor trench device, comprising: an active region having at least one trench extending from a first surface of the device, said trench penetrating first and second semiconductor regions of differing first and second conductivities, a field effect gate electrode at a wall region of the trench, said field effect gate electrode being at a predetermined electrical potential for controlling current across a junction between said first and second regions, a charge accumulation layer formed in said second region by the predetermined potential on the field effect gate electrode; localized regions of said first conductivity being located within said second region and between said first region and a second surface of the device, said localized regions forming part of a thyristor structure, and the portion of said second region which is between adjacent said localized regions forming, in conjunction with said accumulation layer, part of a PIN diode, said accumulation layer acting as the emitter of said thyristor, said localized regions serving to protect said trench against high electric field breakdown while said device is in a non-conductive state, and wherein conduction of said PIN diode is arranged to trigger said thyristor into a conductive state.

3. A MOS-controllable power semiconductor trench device, comprising: an active region having at least one trench extending from a first surface of the device, said trench penetrating an n+ cathode region, a p region and an n base region, a field effect gate electrode at a wall region of the trench formed in the p region and the n base region, said field effect gate electrode being at a predetermined electrical potential, an electron inversion layer formed in the p region, and an electron accumulation layer formed in the n base region by the predetermined potential on the field effect gate electrode; the base region extending towards a p+ anode region; localized regions of p conductivity being located within said n base region between the electron accumulation layer and the p+ anode region, said localized regions forming part of a thyristor structure with the electron accumulation layer as the electron emitter and the p+ anode region as the hole emitter thereof; the portion of the n base region which is between adjacent localized p regions being part of a PIN diode formed in conjunction with said accumulation layer and the p+ anode regions, said localized regions serving to protect said trench against high electric fields while said device is in its off-state, and wherein conduction of said PIN diode is arranged to trigger said thyristor into a conductive state.

4. The device as claimed in claim 2, wherein said localized regions are separate from each other and spaced apart by intervening portions of said second region.

5. The device as claimed in claim 2, wherein said localized regions form part of a continuous layer having apertures therein which constitute said portion.

6. The device as claimed in claim 2, wherein said trench is of substantially rectangular cross-section, and comprises a conductive material having an insulating layer between said trench and the semiconductor regions of the device.

7. The device as claimed in claim 2, wherein said trench is substantially V-shaped or U-shaped in cross-section, and comprises a conductive material having an insulating layer between said trench and the semiconductor regions of the device.

8. The device as claimed in claim 2, wherein said device comprises a wafer of semiconductor material having the first and second surfaces substantially parallel, in which said localized regions are located between a bottom of said trench and said second surface.

9. The device as claimed in claim 8, wherein said localized regions are adjacent to the bottom of the trench, and relatively distant from said second surface.

10. The device as claimed in claim 2, wherein the device consists of a p type silicon substrate in which said second semiconductor region is of n type intrinsic epitaxially grown silicon.

11. The device as claimed in claim 9, wherein said localized regions consist of p type epitaxially grown silicon which is formed within said second semiconductor region.

12. The device as claimed in claim 3, wherein said localized regions are separate from each other and spaced apart by intervening portions of said second region.

13. The device as claimed in claim 3, wherein said localized regions form part of a continuous layer having apertures therein which constitute said portion.

14. The device as claimed in claim 3, wherein said trench is of substantially rectangular cross-section, and comprises a conductive material having an insulating layer between said trench and the semiconductor regions of the device.

15. The device as claimed in claim 3, wherein said trench is substantially V-shaped or U-shaped in cross-section, and comprises a conductive material having an insulating layer between said trench and the semiconductor regions of the device.

16. The device as claimed in claim 3, wherein said device comprises a wafer of semiconductor material having the first and second surfaces substantially parallel, in which said localized regions are located between a bottom of said trench and said second surface.

17. The device as claimed in claim 16, wherein said localized regions are adjacent to the bottom of the trench, and relatively distant from said second surface.

18. The device as claimed in claim 3, wherein the device consists of a p type silicon substrate in which said second semiconductor region is of n type intrinsic epitaxially grown silicon.

19. The device as claimed in claim 18, wherein said localized regions consist of p type epitaxially grown silicon which is formed within said second semiconductor region.

* * * * *